United States Patent

[11] 3,551,747

[72] Inventors John A. Joslyn;
William J. Lubitz, Dalton, Mass.
[21] Appl. No. 801,368
[22] Filed Feb. 24, 1969
[45] Patented Dec. 29, 1970
[73] Assignee General Electric Company
a corporation of New York

[54] PULSE WIDTH MODULATED BRIDGE POWER AMPLIFIER PROTECTION CIRCUIT

10 Claims, 4 Drawing Figs.

[52] U.S. Cl. .......... 317/33, 317/13
[51] Int. Cl. .......... H02h 7/08
[50] Field of Search .......... 307/131; 318/293, 294; 317/13, 33, 46, 51; 330/11P

[56] References Cited

UNITED STATES PATENTS 3,213,287 10/1965 King .......... 307/71
3,427,520 2/1969 Oppedahl .......... 318/18
3,469,177 9/1969 Lorenz .......... 323/19

FOREIGN PATENTS 611,099 10/1948 Great Britain.

*Primary Examiner*—J. D. Miller
*Assistant Examiner*—Harry E. Moose, Jr.
*Attorneys*—John F. McDevitt, Joseph B. Forman, Frank L. Neuhauser and Oscar B. Waddell

ABSTRACT: A bridge power amplifier protection circuit for simultaneously shutting down on all four corners of a bridge power amplifier in response to an overcurrent condition being sensed by an overcurrent-sensing resistor connected in series circuit relationship with the power-switching devices and load or power input terminals of a bridge power amplifier. The bridge power protection circuit comprises a control signal shaping and amplifying circuit that is responsive to the output from the overcurrent-sensing resistor for amplifying and shaping a control signal indicative of the overcurrent condition. A common, fast responding, gate-controlled conducting device such as a silicon control rectifier or other thyristor device has its control gate operatively coupled to and controlled by the output from the control signal shaping an amplifying circuit. The gate control conducting device is connected in common to respective corner-connecting circuits for connecting the common gate control conducting device to control the operation of the respective corner power-switching devices of the bridge power amplifier for turning off all four corner power devices simultaneously in response to the gate-controlled conducting device being rendered conductive upon an overcurrent condition being sensed by the overcurrent-sensing resistor. The overcurrent-sensing resistor preferably is comprised by a plurality of overcurrent-sensing resistors connected in series circuit relationship with the corner power-switching devices and the load and the power input terminals of the bridge power amplifier and an OR gate selection circuit is provided to which the output from the various overcurrent-sensing resistors are supplied. The output of the OR gate selection circuit in turn preferably is supplied to a threshold detecting circuit that operates to turn on the gate-controlled conducting device only upon the output signal level from the OR gate selection circuit exceeding a preset threshold level.

PATENTED DEC 29 1970 3,551,747

SHEET 1 OF 4

INVENTORS
JOHN A. JOSLYN
WILLIAM J. LUBITZ
BY J.F. McDevitt
THEIR ATTORNEY

INVENTORS
JOHN A. JOSLYN
WILLIAM J. LUBITZ

BY E. McDevitt
THEIR ATTORNEY

INVENTORS
JOHN A. JOSLYN
WILLIAM J. LUBITZ
BY J. F. McDevitt
THEIR ATTORNEY

INVENTORS
JOHN A. JOSLYN
WILLIAM J. LUBITZ
BY J.F. McDevitt
THEIR ATTORNEY

PULSE WIDTH MODULATED BRIDGE POWER AMPLIFIER PROTECTION CIRCUIT

BACKGROUND OF THE INVENTION

1. Field of Invention

This invention relates to a new and improved, pulse width modulated, bridge power amplifier protection circuit.

More particularly, the invention relates to a novel protection circuit for automatically detecting current in excess of a given limit, such as would occur when a bridge corner, semiconductor, power-switching device (transistor) shorts, and thereafter quickly and automatically turns off all four corner power-switching devices of the bridge power amplifier to discontinue its further operation and prevent any further propagated failures through the bridge power amplifier.

2. Statement of the Prior Art

Pulse width modulated bridge power amplifiers are now well known in the electronic power drive industry, and are used in a wide variety of industrial and military drive applications. One such known PWM bridge power amplifier is described and claimed in copending application Ser. No. 606,806 (General Electric Pat. Docket 35-53D-362),filed Jan. 3, 1967,now U.S. Pat. No. 3,525,029 J. A. Joslyn and D. A. Citrin, inventors, entitled "Pulse Width Modulation Power Switching Servoamplifier" assigned to the General Electric Company. Briefly, however, a PWM bridge power amplifier comprises a set of four, corner, three terminal semiconductor power-switching devices (such as transistors) two of which are switched to a conducting state intermittently, and cause electric current to be conducted through a load (motor) connected between the diagonally-opposed power-switching devices. The arrangement is such that conduction through one set of diagonally-opposed, corner power-switching devices causes current to flow through the load in a first (forward) direction, and conduction through the remaining set of diagonally-opposed, corner, power-switching devices causes current to flow in a second (reverse) direction. By controlling the conducting intervals of the sets of diagonally-opposed, corner, power-switching devices, the width of the current pulses supplied to the load, and hence its duty cycle, can be proportionally controlled.

While the PWM bridge power amplifiers serve satisfactorily in a wide variety of industrial and military power drive applications, it does possess certain characteristics which render it susceptible to extensive damage in the event of a short circuit failure of one of the corner, power-switching devices. It has been determined that in the event of a short circuit failure of one of the corner power-switching devices through a latent defect in the device, etc., then the failure can be propagated quite rapidly through the bridge power amplifier system, and results in extensive damage to the power amplifier. To avoid this condition, the present invention was devised. The present invention also prevents initial damage to the PWM bridge power amplifier due to excessive load current caused by other malfunctions.

SUMMARY OF INVENTION

It is therefore a primary object of the present invention to provide a new and improved pulse width modulation bridge power amplifier protection circuit which automatically detects current in excess of a given value, such as would occur upon one or more bridge corner power-switching devices (transistors) experiencing a short circuit failure, and thereafter quickly and automatically turns off all four corner, power-switching devices of the bridge power amplifier to discontinue its further operation and prevent any further propagated failures through the bridge power amplifier.

In practicing the invention, a bridge power amplifier protection circuit is provided for simultaneously shutting down all four corners of a bridge power amplifier in response to an overcurrent condition being sensed by overcurrent-sensing means connected in series circuit relationship with the bridge corner power-switching devices and load and power input terminals of a bridge power amplifier. The bridge power protection circuit comprises control signal deriving means responsive to the output from the overcurrent-sensing means for amplifying and shaping a control signal indicative of the overcurrent condition. A common, fast responding, gate-controlled conducting means is operatively coupled to and controlled by the output of the control signal deriving means, and respective corner-connecting means are provided for connecting the common, gate-controlled conducting means to control the operation of the respective corner power devices of the bridge power amplifier for turning off all four bridge corner power devices simultaneously in response to the common, fast responding, gate-controlled conducting means being rendered conductive upon an overcurrent condition being sensed by the overcurrent-sensing means. The overcurrent-sensing means preferably comprises a plurality of overcurrent-sensing devices connected in series circuit relationship with the bridge, corner-switching devices and load and power input terminals of the bridge power amplifier, and the protection circuit also preferably further includes OR gate selection circuit means operatively coupled intermediate the outputs from the control signal deriving means and the input to the common, fast responding, gate-controlled conducting means. It is also preferred that a threshold detecting circuit be interconnected between the output of the OR gate selection circuit and the input to the common, gate-controlled conducting means for assuring that turn-on of the gate-controlled conducting means takes place only upon an output signal level from the OR gate selection circuit exceeding a preset threshold level.

BRIEF DESCRIPTION OF DRAWINGS

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

DETAILED DESCRIPTION OF PREFERRED EMBODIMENTS

Figure 1:
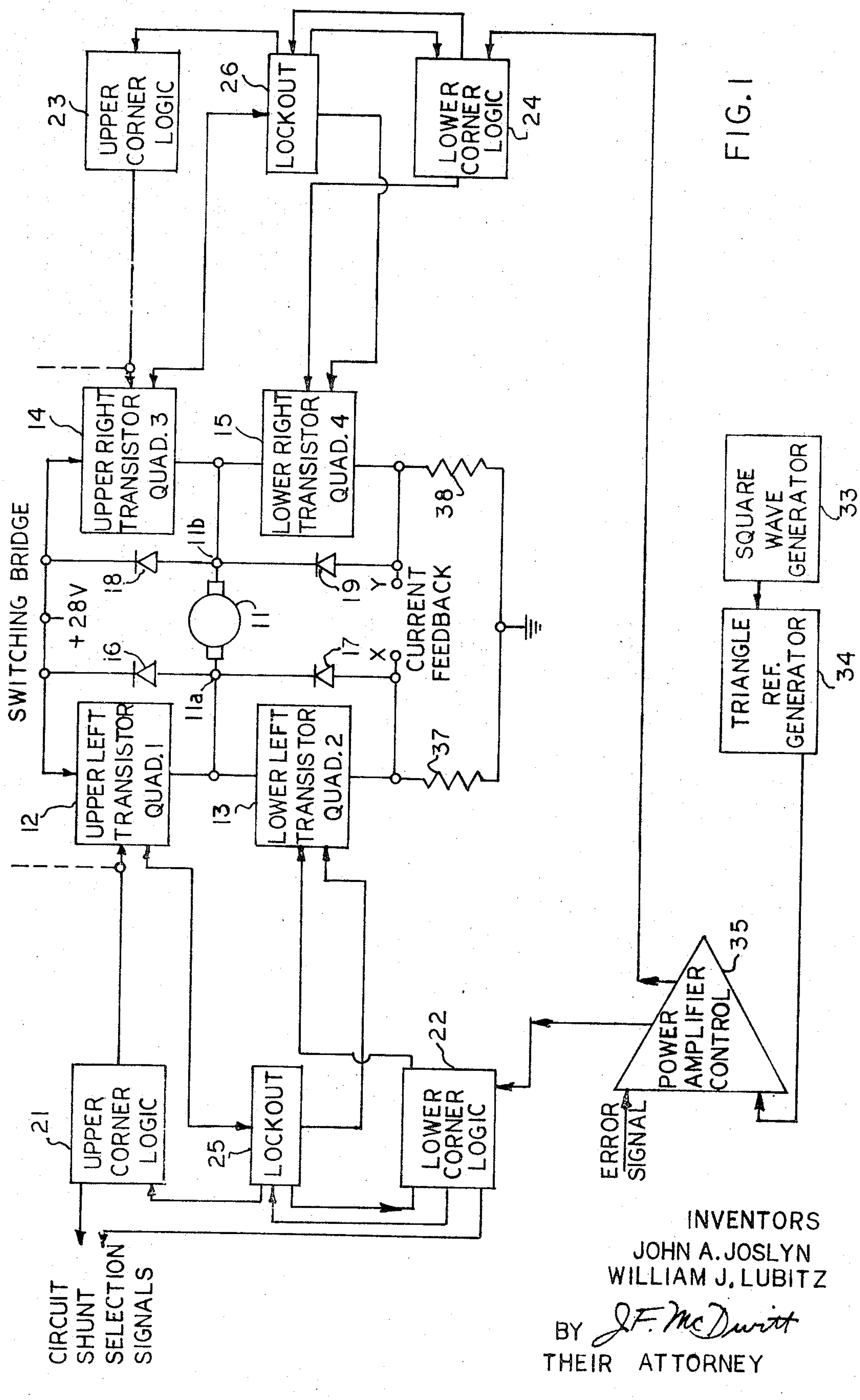
FIG. 1 is a functional block diagram of a known pulse width modulation bridge power amplifier of the type with which the new and improved protection circuit made available by the invention, can be employed.

FIG. 1 is a functional block diagram of an overall pulse width power modulation switching amplifier together with its gating control logic, lockout circuits and driver circuits. For a more detailed description of the PWM bridge power amplifier shown schematically in FIG. 1, reference is made to the above-identified copending application Ser. No. 606,806 (General Electric Pat. Docket 35-53D-362). Briefly, however the PWM bridge power amplifier shown in FIG. 1 is employed to control a servomotor 11 having its load terminals **11*a* and 11*b* excited from a plus 28 volt direct current power source through either the upper left corner power-switching device 12 and lower right corner power-switching device 15, or alternatively, the motor 11** can be driven in the reverse direction by the set of diagonal power-switching devices comprised by the upper right corner power-switching device 14 and the lower left corner power-switching device 13. The power-switching devices 12—15 may comprise parallel connected, switching power transistors, thyristors, etc. which have control electrodes to which appropriate turn-on signals are supplied in accordance with the polarity and magnitude of an input error control signal used to control the operation of the servomotor 11. The turn-on control signal may cause the power-switching devices 12 and 15 to be rendered conductive with the devices 13 and 14 maintained off to thereby allow the plus 28 volt DC source to be applied to the motor 11 between terminal 11*a* and terminal 11*b*. Alternatively, the power-switching devices 14 and 13 may be rendered conductive in which the DC source will be applied to the motor 11 in the reverse direction between terminal 11*b* and terminal 11*a*. The intervals of conduction of these sets of diagonally-opposed power-switching devices are then pulse width modulated (i.e. pulse duration controlled) to determine the value of the current supplied to motor 11 thereby controlling its torque, speed, etc. Because the current supplied to the motor 11 is pulsed in nature, it is necessary to provide some means for recirculating reactive energy trapped in the winding of the motor 11 during intervals of nonconduction of the power-switching devices 12—15. For this purpose, circulating diodes 16—19 are provided, and are connected in reverse polarity, parallel circuit relationship with respective ones of the gate controlled semiconductor power-switching devices 12—15.

In order to cause the PWM bridge power amplifier to operate in the above briefly described manner, the circuit includes corner logic circuit means operatively coupled to and controlling each of the power-switching devices 12—15. The corner logic circuit means are comprised by an upper left corner logic circuit 21, a lower left corner logic circuit 22, an upper right corner logic circuit 23 and a lower right corner logic circuit 24. As might be surmised, the upper left corner logic circuit 21 controls turn-on and turnoff of the upper left corner power-switching device 12, the lower left corner logic circuit 22 controls turn-on and turnoff of the lower left power-switching device 13, the upper right corner logic circuit 23 controls turn-on and turnoff of the upper right power-switching device 14, and the lower right corner logic circuit 24 controls turn-on and turnoff of the lower right semiconductor power-switching device 15. Operation of the upper and lower left corner logic circuits 21 and 22 is controlled, at least in part, by a lockout circuit 25 operatively intercoupling these two corner logic circuits for preventing conduction of either the upper or lower corner power-switching devices 12 or 13 while the other is conducting, and vice versa. Similarly, a lockout circuit 26 is intercoupled between the upper and lower right corner logic circuits 23 and 24 to control operation of these circuits in a similar manner. Lockout is achieved in this fashion through suitable feedback inhibiting signals applied to and developed by the lockout circuits 25 and 26.

The square wave signal generator 33 excites a triangular waveform reference signal generator 34. The triangular waveform reference signal generator 34 supplies its output to one input of a control circuit 35 also having the input error control signal supplied thereto to be used in controlling the operation of the motor 11. In the absence of an input error control signal to the power amplifier control 35, or with a zero input signal, both lower, bridge corner power-switching devices 13 and 15 are rendered conductive so as to in effect ground the input terminals of the servomotor 11.

In operation, the triangular reference signal generated by the generator 34 is added to the input error signal in the amplifier control 35. Upon the occurrence of a positive error signal, the combined value of the triangular reference potential plus the error signal produces a positive switching component which exceeds the threshold value of the left lower corner logic circuit 22. As a result, the associated left lower corner power-switching device 13 is turned off, and the upper corner power-switching device 12 on the same side of the bridge is turned on. The turn-on of the power-switching device 12 is delayed by the lockout circuit 25 until it is certain that the lower corner bridge power-switching device 13 is fully off. Load current will then be supplied to the servomotor through the upper left corner power-switching device 12 and the lower right corner power-switching device 15. Thereafter, due to the periodic nature of the triangular reference, the combined value of the triangular reference potential plus the input error signal will drop below the lower corner threshold value, in which event the upper left corner power-switching device 12 turns off and the feedback diode 17 connected in reverse polarity, parallel circuit relationship with the lower corner power-switching device 13 turns on to circulate coasting current through the motor 11. Should the error signal increase or decrease in value, the combined value of the triangular reference plus the input error signal will either increase or decrease the period of conduction during which the DC voltage source is supplied to the motor 11 thereby pulse width modulating the average current supplied to the servomotor.

In the event that the input error signal plus the triangular reference potential is negative in nature and exceeds the negative threshold level, the lower right corner power-switching device 15 is turned off and the upper right corner power-switching device 14 is turned on by their associated corner logic circuits 23 and 24. This accomplished in a manner similar to that described above for a positive error control signal to thereby provide pulse width modulated current flow in the reverse direction through the servomotor 11.

During operation, the PWM bridge power amplifier has the following three possible allowed states. For zero input error signal both the lower corner power-switching devices 13 and 15 are on and both upper corner power-switching devices 12 and 14 are off. With the power amplifier in this condition, motor current can flow through either of the lower power-switching devices 13 or 15 and the associated, opposite feedback diode 19 or 17, respectively. For positive input error signal, the upper left and lower right corner power-switching devices 12 and 15 are on and the upper right and lower left corner power-switching devices 14 and 13 are off. For negative input error signal, the upper right and lower left corner power-switching devices 14 and 13 are on, and the upper left and lower right corner power-switching devices 12 and 15 are off. In either of the two last-mentioned states, the motor current can flow through an upper transistor switch and a lower transistor switch, or through two feedback diodes in order to pump motor reactive or inertial power back to the 28 volt DC power supply. From the above brief summary, it will be appreciated that regardless of the operating condition of the PWM bridge power amplifier, one or the other of the current-sensing resistors 37 or 38 will have current flowing therethrough which is representative of the total load current flowing in the bridge power amplifier. Should this current exceed a predetermined limit, the excessive current condition will be detected by either of the current-sensing resistors 37 or 38. It should be noted, however, that in the event of a short circuit failure of one of the corner bridge power-switching devices, for example, the lower right corner device 15, should the bridge power amplifier be allowed to continue to operate, and the operating condition become such that the upper right power-switching device 14 is turned on, or transient bridge condition causes the upper right power-switching device 14 to turn one, a dead short circuit will result thereby propagating the failure to other portions of the bridge power amplifier. To prevent such an occurrence, the present protection circuit was devised.

Figure 2:
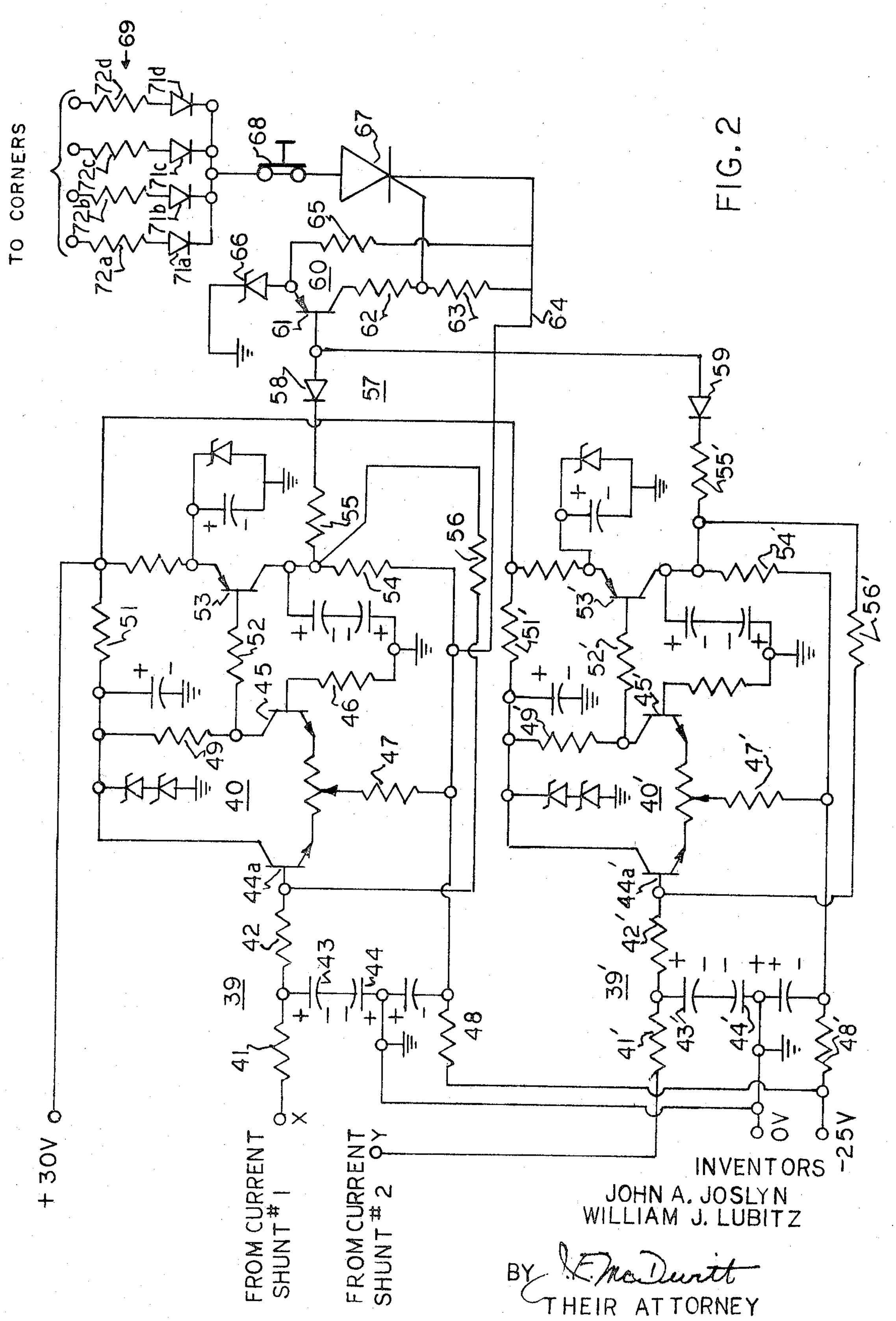
FIG. 2 is a detailed circuit diagram of one form of a protection circuit constructed in accordance with the invention, and which can be used in conjunction with the PWM bridge power amplifier shown schematically in FIG. 1.

FIG. 2 is a detailed, schematic circuit diagram of one form of a protection circuit constructed in accordance with the invention, and suitable for use with the PWM bridge power amplifier shown schematically in FIG. 1. In FIG. 2, the two terminals marked X and Y are connected to corresponding terminals X and Y shown in FIG. 1. From this connection, it will be appreciated that the signal developed across the current-sensing resistor 37 will be conducted through terminal X to one input of the protection circuit, and the signal developed by the current flowing through current-sensing resistor 38 will be conducted through terminal Y to a second input of the protection circuit. Because both the X input and the Y input channels of the protection circuit shown in FIG. 2 are similar in construction, and operate in the same manner, only the X input channel will be described in detail.

The sensed, current condition alarm signal developed across sensing resistor 37 in the PWM bridge power amplifier, is supplied through the input terminal X, and through a noise suppression filter comprised by a T-shaped resistor-capacitor filter network 39 to one input terminal of a differential amplifier 40. The T-shaped noise suppression filter network 39 is comprised of a pair of resistors 41 and 42 whose juncture is connected through a pair of series connected capacitors 43 and 44 to ground, and which operates to eliminate extraneous switching transients, etc. from the signal supplied through input terminal X to the input of the differential amplifier 40. The differential amplifier 40 is a conventional, shunt feedback differential amplifier comprised of a pair of NPN junction transistors **44*a* and 45 with the base electrode of the transister 44*a* being connected directly to the resistor 42 of noise suppression filter 39. The transistor 45 has its base electrode connected through a resistor 46 to ground with the emitters of both transistors 44*a* and 45 being connected through a common emitter resistor 47 and power supply filter resistor 48 back to a source of −25 volt bias potential. The collector of the transistor 45 is connected through a collector load resistor 49 and through a common limiting resistor 51 back to a source of positive 30 volt potential in common with the collector of transistor 44*a* which is connected directly to the end of the common limiting resistor 51. The output from the paired transistors 44*a* and 45 is obtained from the collector of transistor 45 and supplied through a limiting resistor 52 to the base of a PNP output transistor 53. PNP transistor 53 has its emitter connected through a limiting resistor to the source of plus 30 volt potential, and has its collector connected through a load resistor 54 back through filter resistor 48 to the source of −25 volt bias potential. Output from the differential amplifier is obtained across the collector load resistor of PNP transistor 53 and is supplied through a limiting resistor 55 to the input of an OR gate selection circuit shown generally at 57, with the output thus derived being fed back across a shunt feedback path comprised by a resistor 56 to the base of the input transistor 44*a***. The Y channel input section is constructed in a similar manner, and hence the components of the Y channel input section have been given corresponding reference numerals which are primed.

In operation, upon the steady state value of the overcurrent alarm signal applied to terminal X exceeding a predetermined limit, the differential amplifier 40 will be caused to switch its operating state from a normal condition wherein the transistor 45 is conducting to a triggered condition wherein transistor **44*a* is conducting, and transistor 45 is maintained off due to the common emitter coupling through resistor 47. Upon transistor 45 being turned off, PNP transistor 53 turns off and results in the production of a negative enabling potential that is applied to the OR gate selection circuit 57**.

The OR gate selection circuit 57 is comprised of a pair of semiconductor diodes 58 and 59. The OR gate diodes 58 and 59 have their anodes connected in common with the cathode of diode 58 being connected to the limiting resistor 55 that in turn is connected across the collector load resistor 54 of output PNP transistor 53 in the X channel, and the diode 59 has its cathode connected through limiting resistor 55′ across the emitter load resistor 54′ of output PNP transistor 53′ in the Y channel. The commonly connected anode of the OR gate diodes 58 and 59 are connected directly to the base electrode of a PNP transistor 61 comprising a part of a threshold detecting circuit 60. As a result of this arrangement, it will be seen that upon either of the PNP output transistors 53 of the X channel, or 53′ of the Y channel being turned off in the above briefly described manner, a negative enabling potential will be supplied from the −25volt source through either of the OR gate diodes 58 or 59 to the base electrode of the PNP transistor 61 in the threshold detector circuit 60.

The threshold detector circuit 60 is comprised of the PNP transistor 61 having its collector electrode connected through two series connected collector load resistors 62 and 63 to a supply terminal 64 that in turn is connected through the filter resistor 48 back to the −25 volt source of bias potential. The emitter of PNP transistor 61 is connected through an emitter resistor 65 to the supply terminal 64 and is also connected through a zener diode 66 back to ground. The zener diode 66 serves as a reference potential clamp for the emitter of PNP transistor 61, and hence causes the circuit to operate as a threshold voltage detector determined by the voltage rating of the zener diode 66. Upon the voltage rating of the zener diode 66 being exceeded by the negative potential applied to the base of PNP transistor 61 dropping below a predetermined limit, the PNP transistor 61 will be rendered conductive and produce a positive going trigger current pulse in the collector load resistors 62 and 63.

The juncture of the collector load resistors 62 and 63 are connected directly to the control gate of a gate control conducting means comprised by a gate-controlled, solid-state, semiconductor, silicon controlled rectifier thyristor device 67 having its cathode connected directly to the supply terminal 64. The anode of the silicon control rectifier thyristor 67 is connected through a normally closed pushbutton switch 68 to a plurality of respective corner connecting circuits shown generally at 69. Each of the respective corner connecting circuits 69 are comprised of isolating, unidirectional conducting semiconductor diodes **71*a*—71*d* with each isolating diode being connected in series circuit relationship with a respective current-limiting resistor 72*a*—72*d*. Each of the current-limiting resistors 72*a*—72*d* are connected back to the respective upper and lower left corner logic circuits 21 and 22, and the upper and lower right corner logic circuits 23 and 24 of the PWM bridge power amplifier circuits shown in FIG. 1. To be precise, the respective current limiting resistors 72*a*—72*d* are connected to the base electrodes of transistors 64, 64′, 64″ and 64‴ (described in the above-referenced copending Pat. application Ser. No. 606,806, General Electric Patent Docket 35-53D-362) for controlling the operation of the logic circuits 21—24. By this arrangement, upon the commonly connected, gate-controlled SCR 67 being gated on, it will serve to clamp the base electrodes of the various control transistors 64, 64′, 64″ and 64‴ to the potential of the supply terminal 64, and serves to inhibit these control transistors from being turned on. In this manner, all four corner power-switching devices 12—15** are immediately turned off, and prevented from further operation so as to positively prohibit any further propagation of the short circuit fault through the bridge power amplifier.

The overall operation of the protection circuit shown in FIG. 2 is as follows. Upon an overcurrent condition being sensed by either of the current-sensing resistors so as to supply a positive, overcurrent alarm signal through either of the input terminals X or Y, either of the differential amplifiers 40 or 40′ will be caused to be switched from its normal state to its triggered, alarm state thereby producing a negative going enabling potential that is supplied through either one of the OR gate diodes 58 or 59 to the base electrode of the threshold detector transistor 61. Upon this enabling potential going sufficiently negative, the threshold detector transistor 61 is rendered conductive and supplies a turn-on gating current to the control electrode of the commonly connected, gate-controlled SCR 67. Upon SCR 67 being turned on, it will clamp the potential of the respective corner logic circuit to the inhibiting negative potential supplied through terminal 64 from the −25 volt source of bias potential. The entire process required to shut down all four corner power-switching transistors in the bridge power amplifier requires less than 25 microseconds upon a fault current peak through the bridge power amplifier exceeding a safe limit. In order to again place the bridge power amplifier in operation, the reset pushbutton 68 must be operated and results in commutating off the commonly connected gate control SCR 67. Alternatively, a master switch controlling the power supply to the PWM bridge power amplifier may be cycled open and then closed (following clearing of the original fault) to allow the SCR 67 to be returned to its normal, nonconducting current blocking condition.

Figure 3:
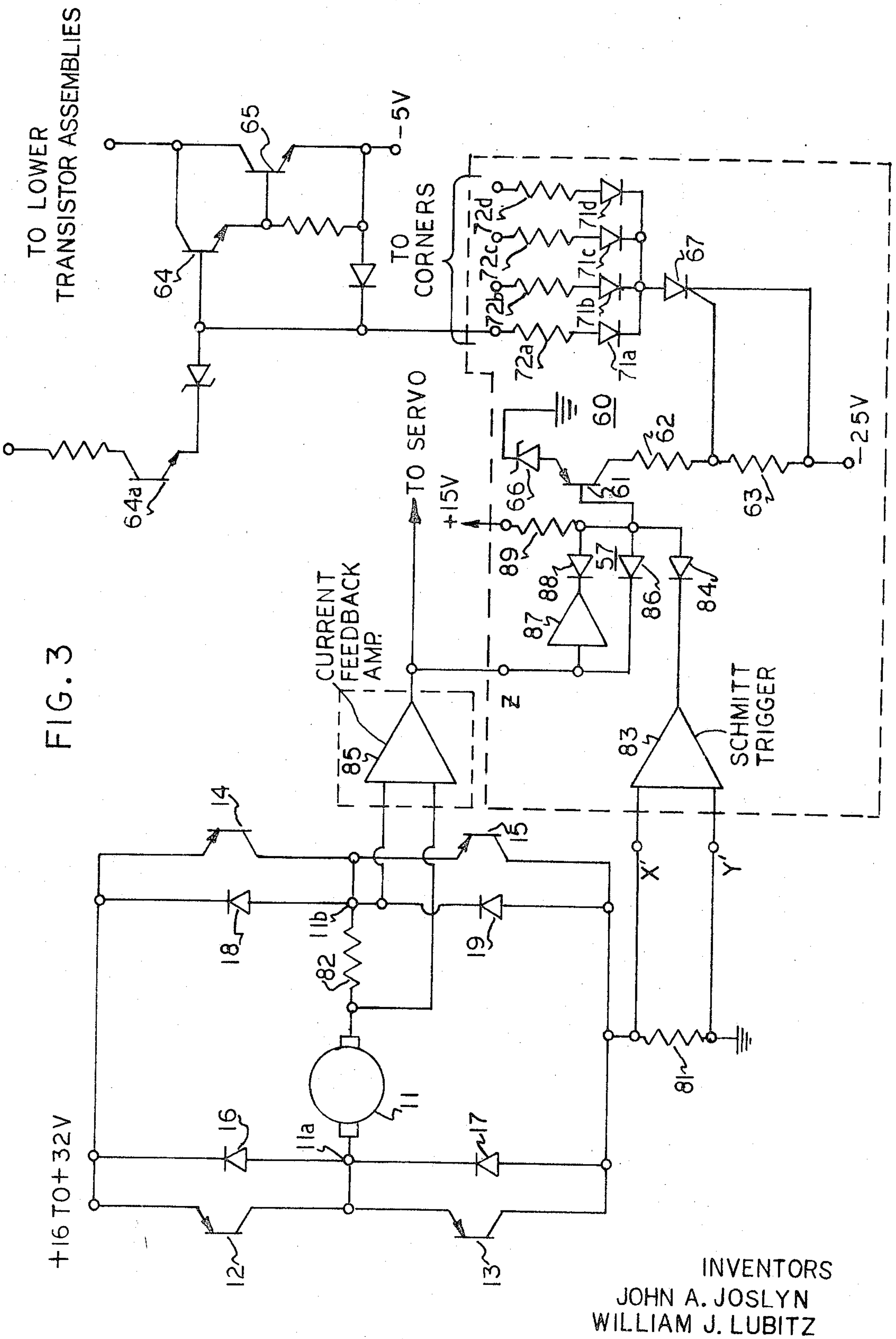
FIG. 3 is a schematic circuit diagram of an overall PWM bridge power amplifier including a second embodiment of a new and improved protection circuit coupled thereto which is constructed in accordance with the invention.

FIG. 3 is a schematic circuit diagram of an alternative form of a protection circuit diagram of an alternative form of a protection circuit for a PWM bridge power amplifier constructed in accordance with the invention. The embodiment of the invention shown in FIG. 3 is designed for use with a PWM bridge power amplifier which utilizes a single, common current sensing resistor 81 connected in series circuit relationship with each of the lower corner power-switching devices 13 and 15. In addition, an average load current-sensing resistor 82 is connected in series circuit relationship with the load 11 intermediate the load terminals 11*a* and 11*b*. With this arrangement of current sensing resistors 81 and 82, the single common current-sensing resistor 81 will sense any overcurrent condition due to a short circuit of any one of the bridge corner power-switching devices 12—15, and the average load current-sensing resistor 82 will sense any increase in the average load current through the motor load 11 above a predetermined safe limit.

The output alarm signal developed across the common, current-sensing resistor 81 is supplied through a pair of input terminals X′ and Y′ to a Schmitt trigger circuit 83 whose output supplies one of the diodes 84 of an OR gate selection circuit 57. The alarm signal developed across the average load current-sensing resistor 82 is supplied to the input of a feedback stabilized amplifier 85 and through an input terminal Z to the input of an inverting amplifier 87 with both of the amplifiers 85 and 87 comprising conventional micro 709 monolithic integrated circuit amplifier chips. The output of inverting amplifier 87 is connected to a diode 88 comprising a part of the OR gate selection circuit 57. The input terminal Z also is connected directly to a second diode 86 comprising a part of the OR gate selection circuit. It will be seen, therefore, that the OR gate selection circuit 57 is comprised of the diodes 84, 86 and 88 which have the cathodes thereof connected to the output of the Schmitt trigger 83, the input terminal Z to the output of the current amplifier 85, and to the output of the inverting amplifier 87, respectively, and that the anodes of all of the OR gate diodes 84, 86 and 88 are connected through a common resistor 89 to a source of positive 15 volt potential.

The commonly connected anodes of all of the OR gate diodes 84, 86 and 88 also are connected to the base electrode of a PNP transistor 61 that comprises a part of a threshold voltage detector 60. The PNP transistor 61 has its emitter electrode connected through a 10 volt zener diode to ground, and has its collector electrode connected through a pair of series connected collector resistors 62 and 63 to a source of −25 volt potential. The juncture of the collector resistor 62 and 63 is connected to the control gate of a common, gate controlled conducting device 67 that preferably comprises a silicon controlled rectifier thyristor. The common, gate controlled SCR thyristor 67 has its anode connected in common to a plurality of connecting circuit means comprised by respective isolating diodes 71*a*—71*d* connected in series circuit relationship with respective associated limiting resistors 72*a*—72*d* to control the operation of each of the bridge corner power switching devices 12—15. As is indicated in FIG. 3, for this purpose each of the isolating diodes such as 71*a* and its series connected current limiting resistor 72*a*, is connected directly to the base of a control transistor 64 which is turn controls turn-on and turnoff of one of the corner, power-switching devices such as 12 of the bridge power amplifier. For a more detailed description of the construction and operation of the corner logic control circuitry depicted by the transistors 64, 65 and 64*a* reference is made to the above-identified copending U.S. Pat. application Ser. No. 606,806 (General Electric patent docket 35-53D-362).

The overall operation of the embodiment of the invention shown in FIG. 3 of the drawings is as follows. In the event of a short circuit failure of any one of the bridge corner power switching transistors 12—15, the current sensed by the current sensing resistor 81 will cause the Schmitt trigger 83 to be triggered from its normal operating state to a second, different operating state that provides a negative enabling potential to the OR gate diode 84. This results in drawing down or supplying a negative turn-on potential to the base of the PNP transistor 61 comprising a part of the voltage threshold detector 60.

Alternatively, in the event that the average load current through the motor load 11 exceeds a given, limit value either in the forward (positive polarity direction) or exceeds a limit in the reverse (negative polarity direction), an output signal will be produced at the output of the current amplifier 85 which will be indicative of this abnormal, average load current condition. Thus, it will be appreciated that the alarm signal appearing at the output of the current amplifier 85 and supplied through the input terminal Z may be either of a positive or negative polarity corresponding to an excessive average load current flow in either the forward positive direction or in the reverse negative direction. In the event that the average load current value exceeds the limit in the reverse negative direction, a negative polarity alarm signal will be supplied through the input terminal Z directly to the diode 86 in the OR gate selection circuit 57. In the event that the average load current through the motor load 11 exceeds a limit in the forward positive direction, a positive polarity alarm signal will be supplied through the input terminal Z and through the inverting amplifier 87 to the diode 88 of the OR gate selection circuit 57. The inverting amplifier 87 serves to invert this positive polarity alarm signal to a negative polarity signal that operates the diode 88 of the OR gate selection circuit 57. Upon either of the OR gate diodes 86 or 88 being rendered conductive in the above-described manner, they too can serve to apply a negative turn-on potential to the base electrode of the PNP transistor 61 in the voltage threshold detector circuit 60.

Upon the negative turn-on potential being supplied to the base electrode of the PNP transistor 61 from any one of the OR gate diodes 84, 86 or 88, exceeding a preset limit determined by the zener diode 66, the PNP transistor 61 will be rendered conductive. Upon PNP transistor 61 being rendered conductive, a positive polarity gating-on signal will be supplied to the gate electrode of the common SCR 67 causing this device to be turned-on and to clamp all four corner turn-on transistors, such as 64, to the −25 volt source of negative potential. In this manner, all four corner power-switching devices 12—15 of the bridge power amplifier will be clamped off simultaneously so as to avoid any further propagation of a short circuit failure condition through the bridge power amplifier.

Figure 4:
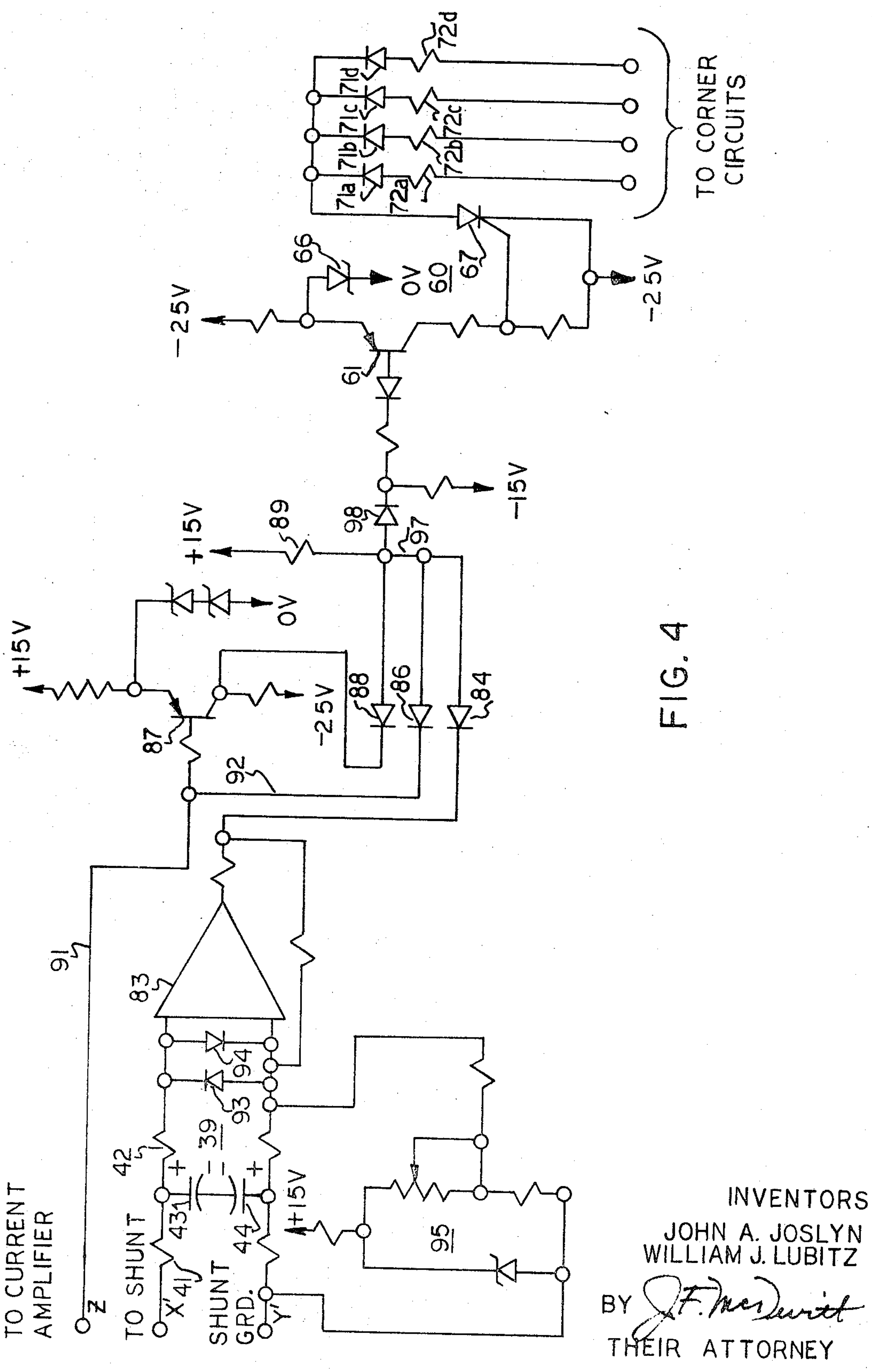
FIG. 4 is a detailed circuit diagram of the construction of the protection circuit employed in the overall PWM bridge power amplifier system and protection circuit shown schematically in FIG. 3.

FIG. 4 is a detailed schematic, circuit diagram of the embodiment of the invention shown in FIG. 3 with respect to the signal deriving and amplifying circuit functions, the OR gate, the voltage detector and the common SCR gate-controlled conducting device. As stated earlier, the amplifier 85 shown in FIG. 3 is a conventional, commercially available, monolithic integrated circuit structure such as the micro 709 circuit manufactured by the Fairchild Camera and Instrument Company, Texas Instruments, Motorola, ITT, etc. connected so as to function as a feedback stabilized amplifier. Amplifier 85 has its output supplied to the input terminal Z, as well as being fed back to the servosystem of which the protection circuit and the PWM bridge power amplifier comprise a part. The input terminal Z is connected through a conductor 91 to a conductor 91 to the inverting amplifier 87, but said connection could be made to the base electrode of a PNP transistor serving the function as an inverting amplifier. In such alternate PNP transistor form of mechanization said transistor in turn has its collector electrode connected to the cathode of an OR gate diode 88 whose anode is connected through the common resistor 89 to a source of positive 15 volt potential. In addition, the input terminal Z is directly connected through the conductor 91, and through a second conductor 92, to the cathode of a second OR gate diode 86 whose anode is connected in common with the anode of diode 88 to resistor 89.

The alarm, overcurrent signal detected by the current sensing resistor 81 shown in FIG. 3, is supplied through the input terminals X' and Y' to a noise suppression filter 39 whose output is connected across the input terminals of the Schmitt trigger circuit 83. The output from the noise suppression filter 39 may be clamped or limited between preset safe values (to protect Schmitt trigger 83) by a pair of diodes 93 and 94 connected in reverse polarity, parallel circuit relationship across the input terminals of the Schmitt trigger circuit 83. A difference signal level adjusting circuit shown generally at 95 may be connected across the noise suppression filter 39 for adjusting the level of the potential difference sufficient to trigger the Schmitt trigger 83 from its normal operating state to a second, triggered operating state whereby the OR gate diode 84 connected to its output will be enabled with a negative potential. The Schmitt trigger itself is a conventional, commercially available, monolithic integrated circuit chip such as the micro 709 microminiaturized, monolithic integrated circuit manufactured and sold by the Fairchild Camera and Instrument Company, Texas Instruments, etc. and which is appropriately interconnected through external or discrete circuit connections to operate as a Schmitt trigger. In operation, the Schmitt trigger 83 will normally be operating in a first state whereby no negative enabling potential is supplied to the diode 84 connected to its output. The noise suppression filter 39 serves to filter out any transient switching potentials, etc. so as to apply to the Schmitt trigger 83 only a steady state, excessive current alarm signal that is sufficient to trigger the Schmitt trigger 83 from its normal, first operating state, to a triggered operating condition whereby a negative enabling potential is supplied to the OR gate diode 84 connected to its output.

Upon any one of the OR gate diodes 84, 86 or 88 being rendered conductive by the application of a negative enabling potential to its cathode, in any one of the previously described manners, conduction of this diode will cause the potential level of the terminal point 97 to be driven sufficiently negative to block current conduction through a diode 98. Upon diode 98 being blocked, the potential applied to the base of the PNP transistor 61 in the threshold voltage detector 60 is driven negative so that upon reaching and exceeding the limiting value of 10 volts established by the zener diode 66, the PNP transistor 61 will be rendered conductive. Thus, it will be appreciated that the detector circuit 60 establishes a threshold voltage level which must be exceeded prior to the PNP transistor 61 being turned on. Upon PNP transistor 61 being rendered conductive, a positive gating on potential will be applied to the control gate of the SCR 67.

Upon the common, gate controlled SCR 67 being gated on, it will become conductive and clamp each of the respective connecting circuit means comprised by the respective series connected isolating diodes **71*a*—71*d* and their series connected limiting resistors 72*a*—72*d* to the value of the −25 volt bias potential. It will be appreciated therefore that turn-on of the common, gate-controlled silicon control rectifier thyristor device 67 causes all of the respective corner connecting circuits comprised by the series connected isolating diodes and limiting resistors 71*a*—71*d* and 72*a*—72*d* respectively to clamp the base electrodes of the gating on transistors (such as the NPN transistor 64 shown in FIG. 3) to the −25 volt source of bias potential. This results in clamping off all four corner bridge power-switching devices 12—15** thereby assuring that any further propagation of the short circuit fault through the remaining portions of the bridge power amplifier will be avoided.

From the foregoing description it will be appreciated that the invention provides a new and improved pulse width modulation bridge power amplifier protection circuit which automatically detects current in excess of a given limit, such as would occur upon one or more of the bridge corner semiconductor power-switching devices (transistors) being subjected to a short circuit failure, and thereafter quickly and automatically turns off all four corner power-switching devices of the bridge power amplifier to discontinue its further operation, and to prevent any further propagated failures through the bridge power amplifier.

Having described several embodiments of a new and improved PWM bridge power amplifier protection circuit constructed in accordance with the invention, it is believed obvious that other modifications and variations of the invention will be possible in the light of the above teachings. It is therefore to be understood that changes may be made in the particular embodiments of the invention described which are within the full intended scope of the invention as defined by the appended claims.

We claim:

1. A bridge power amplifier protection circuit for simultaneously shutting down all four corners of a bridge power amplifier in response to an overcurrent condition being sensed by overcurrent-sensing means connected in series circuit relationship with the power-switching devices and load and input power terminals of a bridge power amplifier, said bridge power amplifier protection circuit comprising control signal deriving means responsive to the output from the overcurrent sensing means for amplifying and shaping a control signal indicative of the overcurrent condition, common fast responding gate-controlled conducting means operatively coupled to and controlled by the output from said control signal deriving means, and respective corner connecting means for connecting said common gate-controlled conducting means to control the operation of the respective corner power devices of the bridge power amplifier for turning off all four corner power devices simultaneously in response to said common fast responding gate-controlled conducting means being rendered conductive upon an overcurrent condition being sensed by the overcurrent-sensing means.

2. A bridge power amplifier protection circuit according to claim 1 further including threshold detecting circuit means interconnected between the output of the control signal deriving means and the input to the common gate-controlled conducting means for assuring that turn-on of said gate-controlled conducting means takes place only upon the output signal level from the control signal deriving means exceeding a preset threshold level.

3. A bridge power amplifier protection circuit according to claim 1 wherein the overcurrent-sensing means comprises a plurality of overcurrent-sensing devices connected in series circuit relationship with the power-switching devices and load and power input terminals of the bridge power amplifier, and the protection circuit further includes OR gate selection circuit means operatively coupled intermediate the outputs from the control signal deriving means and the input to the common fast responding gate controlled conducting means.

4. A bridge power amplifier protection circuit according to claim 3 further including threshold detecting circuit means interconnected between the output of the OR gate selection circuit means and the input to the common gate-controlled conducting means for assuring that turn-on of said gate-controlled means takes place only upon an output signal level from the OR gate selection circuit means exceeding a preset threshold level.

5. A bridge power amplifier protection circuit according to claim 4 wherein the plurality of overcurrent-sensing devices are comprised of a first current-sensing resistor connected in common and in series circuit relationship with each of the lower corner power devices of the power bridge, and a second average load current-sensing resistor connected in series circuit relationship with the load terminals for sensing the average current through a load supplied by the bridge power amplifier.

6. A bridge power amplifier protection circuit according to claim 4 wherein the common gate-controlled conducting means comprises a gate-controlled solid-state semiconductor thyristor device having its control gate connected to the output from the threshold detecting circuit means and having its load terminals interconnected between a source of clamping-off potential and through the respective corner connecting means to the control elements of the respective corner power devices comprising the bridge power amplifier whereby upon the thyristor device being rendered conductive, all four corner power devices of the power bridge are clamped off simultaneously.

7. A bridge power amplifier protection circuit according to claim 6 wherein the respective corner connecting means are connected in common to one of the load terminals of the gate controlled solid-state semiconductor thyristor device and comprise isolating unidirectional conducting semiconductor diodes connected in series circuit relationship with current-limiting resistors adapted to be connected to the respective control elements of the corner power-switching devices comprising the bridge power amplifier.

8. A bridge power amplifier protection circuit according to claim 7 wherein the plurality of overcurrent-sensing devices comprise current-sensing resistors connected in series circuit relationship with the respective lower corner power devices of the power bridge, and the control signal deriving means comprises respective differential amplifiers having the inputs thereof adapted to be connected to respective ones of the current-sensing resistors and having the outputs thereof connected to respective inputs of the OR gate selection circuits means.

9. A bridge power amplifier protection circuit according to claim 7 wherein the plurality of overcurrent-sensing devices are comprised of a first current-sensing resistor connected in common and in series circuit relationship with each of the lower corner power devices of the power bridge and a second average load current-sensing resistor connected in series circuit relationship with the load terminals for sensing the average current through a load supplied by the bridge power amplifier, and the control signal deriving circuit means comprises a Schmitt trigger wave-shaping and amplifying circuit having its trigger input coupled across the first current-sensing resistor and its output connected to an input of the OR gate selection circuit means, and a feedback stabilized, reversible polarity alarm signal amplifier having its input coupled across the second average load current-sensing resistor and having a first output connection directly to a second input of the OR gate selection circuit means, and having a second output connection through an inverting amplifier to a third input of the OR gate selection circuit means.

10. A bridge power amplifier protection circuit according to claim 9 wherein the circuit is fabricated in hybrid integrated circuit form and at least the alarm signal amplifier, Schmitt trigger, inverting amplifier, and threshold detector all are fabricated in monolithic microminiaturized integrated circuit form.